United States Patent
Tasaki et al.

(10) Patent No.: US 8,704,258 B2
(45) Date of Patent: Apr. 22, 2014

(54) WHITE COLOR REFLECTING MATERIAL AND PROCESS FOR PRODUCTION THEREOF

(75) Inventors: Masutsugu Tasaki, Saitama (JP); Naoto Igarashi, Saitama (JP); Tsutomu Odaki, Saitama (JP); Maimi Yoshida, Saitama (JP)

(73) Assignee: Asahi Rubber Inc., Saitama (JP)

( * ) Notice: Subject to any disclaimer, the term of this patent is extended or adjusted under 35 U.S.C. 154(b) by 0 days.

(21) Appl. No.: 13/380,661

(22) PCT Filed: Jun. 25, 2010

(86) PCT No.: PCT/JP2010/060875
§ 371 (c)(1),
(2), (4) Date: Feb. 15, 2012

(87) PCT Pub. No.: WO2010/150880
PCT Pub. Date: Dec. 29, 2010

(65) Prior Publication Data
US 2012/0138997 A1    Jun. 7, 2012

(30) Foreign Application Priority Data

Jun. 26, 2009 (JP) ................................. 2009-152828
Mar. 23, 2010 (JP) ................................. 2010-065888

(51) Int. Cl.
*H01L 33/00* (2010.01)
(52) U.S. Cl.
USPC ........................................................ 257/98
(58) Field of Classification Search
USPC ........................................................ 257/98
See application file for complete search history.

(56) References Cited

U.S. PATENT DOCUMENTS

| 6,632,892 B2 | 10/2003 | Rubinsztajn et al. |
| 7,569,989 B2 | 8/2009 | Niitta et al. |

(Continued)

FOREIGN PATENT DOCUMENTS

| EP | 2 075 280 A1 | 7/2009 |
| EP | 2 448 026 A1 | 5/2012 |

(Continued)

OTHER PUBLICATIONS

International Search Report in International Application No. PCT/JP2010/060875; dated Aug. 3, 2010 (with English-language translation).

(Continued)

*Primary Examiner* — Thao P. Le
(74) *Attorney, Agent, or Firm* — Oliff PLC

(57) ABSTRACT

A general-use white color reflecting material, and a process for production thereof are provided. The white color reflecting material, without troublesome surface treatment such as formation of a reflective layer by plating, is capable of reflecting a near-ultraviolet ray of a wavelength region of 380 nm or longer or a near-infrared ray sufficiently without light leakage; does not become yellow even when exposed to near-ultraviolet rays; has excellent lightfastness, heat resistance, and weatherability; has high mechanical strength and chemical stability; is capable of maintaining a high degree of whiteness; and is easily moldable at a low cost. Further a white color reflecting material used as an ink composition for producing the white color reflecting material in a film shape is also provided. The white color reflecting material comprises; a silicone resin or silicone rubber formed from titanium oxide-containing silicone composition, in which anatase-type or rutile-type titanium oxide particles are dispersed.

20 Claims, 7 Drawing Sheets

(56) References Cited

U.S. PATENT DOCUMENTS

| | | | |
|---|---|---|---|
| 7,990,606 B2* | 8/2011 | Hakii | 359/297 |
| 2002/0061392 A1 | 5/2002 | Jacobsen et al. | |
| 2004/0018347 A1 | 1/2004 | Jacobsen et al. | |
| 2005/0046018 A1 | 3/2005 | Jacobsen et al. | |
| 2006/0226758 A1 | 10/2006 | Sofue et al. | |
| 2006/0261366 A1 | 11/2006 | Yang | |
| 2008/0036087 A1 | 2/2008 | Jacobsen et al. | |
| 2008/0117619 A1 | 5/2008 | Pang et al. | |
| 2008/0210966 A1* | 9/2008 | Sakamoto et al. | 257/98 |
| 2009/0032829 A1 | 2/2009 | Chew et al. | |
| 2009/0057708 A1 | 3/2009 | Abdul Karim et al. | |
| 2009/0171013 A1 | 7/2009 | Taguchi et al. | |
| 2009/0189180 A1 | 7/2009 | Murai et al. | |
| 2009/0194320 A1 | 8/2009 | Okumura | |
| 2009/0242847 A1* | 10/2009 | Hosoya et al. | 252/500 |
| 2009/0246499 A1 | 10/2009 | Katsoulis et al. | |
| 2009/0267099 A1 | 10/2009 | Sakai | |
| 2011/0236632 A1* | 9/2011 | Hosokawa et al. | 428/141 |

FOREIGN PATENT DOCUMENTS

| | | |
|---|---|---|
| JP | A-5-315654 | 11/1993 |
| JP | A-2003-501676 | 1/2003 |
| JP | A-2004-012810 | 1/2004 |
| JP | A-2005-136378 | 5/2005 |
| JP | A-2006-124600 | 5/2006 |
| JP | A-2006-240073 | 9/2006 |
| JP | A-2006-316173 | 11/2006 |
| JP | A-2006-324623 | 11/2006 |
| JP | A-2006-343445 | 12/2006 |
| JP | A-2007-270054 | 10/2007 |
| JP | A-2008-135390 | 6/2008 |
| JP | A-2008-143981 | 6/2008 |
| JP | A-2008-159713 | 7/2008 |
| JP | A-2008-187030 | 8/2008 |
| JP | A-2008-222828 | 9/2008 |
| JP | A-2008-251316 | 10/2008 |
| JP | A-2008-251604 | 10/2008 |
| JP | A-2009-010360 | 1/2009 |
| JP | A-2009-021394 | 1/2009 |
| JP | A-2009-129801 | 6/2009 |
| JP | A-2009-141318 | 6/2009 |
| JP | A-2009-164275 | 7/2009 |
| JP | A-2009-182149 | 8/2009 |
| JP | A-2010-010279 | 1/2010 |
| JP | A-2010-232252 | 10/2010 |
| WO | WO 2007/072659 A1 | 6/2007 |
| WO | WO 2007 074892 A1 | 7/2007 |

OTHER PUBLICATIONS

Mar. 22, 2011 International Search Report issued in International Application No. PCT/JP2010/073445.

Jul. 16, 2013 extended European Search Report and Aug. 2, 2013 Supplementary European Search Report issued in European Patent Application No. 10848500.

Jul. 16, 2013 extended European Search Report and Aug. 2, 2013 Supplementary European Search Report issued in European Patent Application No. 10792198.

U.S. Appl. No. 13/636,963, filed Sep. 24, 2012.

Dec. 2, 2013 Office Action issued in U.S. Appl. No. 13/636,963.

\* cited by examiner

US 8,704,258 B2

WHITE COLOR REFLECTING MATERIAL AND PROCESS FOR PRODUCTION THEREOF

TECHNICAL FIELD

The present invention relates to a white color reflecting material and a method for producing the same. The white color reflecting material is used as a base plate on which a semiconductor optical device such as a semiconductor light-emitting component and a solar cell component is mounted, and is also used as a member of a semiconductor optical device package such as a reflector which is configured to accommodate and surround the optical component. The while color reflecting material has a good stability against light and heat ray, has a high reflecting efficiency without light leakage and is capable of stably maintaining the above mentioned properties for a long period of time.

BACKGROUND OF THE INVENTION

Light-emitting diodes (i.e. LEDs) are used as light sources for various light-emitting instruments such as lighting appliances, traffic signals, backlights for liquid crystal displays, etc. The light-emitting diodes, in particular, high intensity light-emitting diodes, are more generally used because they have longer lifetimes and lower power consumption compared to the whitish color lighting units such as incandescent light bulbs, halogen lamps, mercury lamps, fluorescent lamps, etc.

As shown in FIG. 12, the LED that is used as a light source of a conventional light-emitting instrument has a light-emitting component 33 which is mounted on a substrate 40 made of alumina ceramics, glass fiber-containing epoxy resins or bismaleimide-triazine resins. And leads 34a, 34b that extend from the light-emitting component 33 are connected to a wiring 35a, 35b on the substrate 40 respectively. The light-emitting component 33 on the substrate 40 is surrounded by a small whitish color package molding member (i.e. reflector) 30 measuring approximately several millimeters to several centimeters. The whitish color package molding member is made of resin such as polyether, polyphthalamide, polyether ether ketone or precious ceramics such as alumina, and has an opening in a light exiting direction. These devices and members mentioned above are integrated into one body to constitute a semiconductor light-emitting unit.

In a case where the substrate 40 or the package molding member (i.e. reflector) 30 is made of the resin, the resin is thermally degraded during lead-free-reflow soldering by which the semiconductor light-emitting unit is fixed to a circuit, and is photo-degraded when the wavelength is in an ultraviolet region. In particular, in a case where high intensity light-emitting diodes are used, the light gradually causes inferiority through yellowing or browning, dullness in the surface color and deterioration in light reflectance of the resin, due to high intensity of the strong emitted light and high temperatures associated with it. On the other hand, in a case where the substrate 40 or the package molding member (i.e. reflector) 30 are made of ceramics, no photo and thermal degradations due to ultraviolet ray are observed, but the emitted light tends to leak out, obtaining insufficient illuminance.

The surface of the substrate or the package molding member has been plated so as to reflect light. When the surface is plated with silver, high reflectance of light is obtained but the reflectance is deteriorated when sulfurization occurs to be blackish, being unfavorable. When the surface is plated with gold, excellent anti-sulfurization and anti-oxidation properties are achieved, but the reflectance becomes low, cost rises and it lacks versatility, too, being unfavorable. Furthermore, high precision plating treatments are required for the surface of these small substrates and the package molding members, so that complex steps are needed in plating process, accordingly productivity also decreases, being unfavorable.

In Japanese Patent Publication JP2006-343445A, a light reflecting material is disclosed. It is prepared without plating processes, has resistant to light deterioration and is less likely to leak light. The light reflecting material has a weather resistant layer with an ultraviolet ray absorbing function on one surface of a light reflecting layer, and also has a light shielding layer on the other surface. The light reflecting layer comprises a composition including an aromatic polycarbonate resin and a rutile-type titanium oxide of white pigment with low catalyzing activity for decomposition.

Light-emitting diodes that are capable of emitting light having a short wavelength region near lower limit of the visible region or the ultraviolet region have been manufactured recently. A reflecting material made of plastics such as a rutile-type titanium oxide-containing polycarbonate resin cannot sufficiently reflect light that is emitted from such light-emitting diode and has a wavelength region of 360 nm or over near the lower limit in the visible region, in particular, the wavelength region of 380 to 400 nm.

In Japanese Patent Publication JP2008-143981A, a semiconductor light-emitting unit is disclosed, in which a base plate and a light-emitting component are bonded with a resin composition. The resin composition comprises an anatase-type titanium oxide that is dispersed in an epoxy resin, and has a good light reflecting efficiency in a broad wavelength region. However, change in light reflectance with time is large, and the epoxy resin is gradually degraded. Therefore, the light reflecting efficiency deteriorates with time.

Furthermore, in light-emitting diodes, silicone type sealing resins which have excellent heat-resistance and light-resistance have come into use as sealing resins under a trend of shortening in wavelength and increasing in output power of emitting light. However, their adhesiveness is insufficient due to differences in, for example, a degree of shrinkage between the silicone type sealing resin and the conventional package member made of resin such as polyether, polyphthalamide, polyether ether ketone, etc. Accordingly, newly designed packages are desired.

The conventional reflecting material made of plastics cannot efficiently reflect light of the wavelength region of 380 to 400 nm and a longer wavelength region in the visible region and a heat ray having further longer wavelength in the infrared region as heat rays. Therefore, a general-use reflecting material is desired, which can sufficiently reflect such wavelength light, can exhibit excellent heat and light resistances, and has no change in color, excellent durability and no declining in light reflectance after a long period of use. It can also be used not only for lighting equipment that emits light but also for a solar cell assembly that converts sunlight into electricity.

SUMMARY OF THE INVENTION

The present invention has been developed to solve the problems mentioned above, and an object of the present invention is to provide a general-use white color reflecting material and a method for producing the same. The white color reflecting material can be produced without troublesome surface treatment such as formation of a reflective layer using a plating method, and is capable of sufficiently reflecting a near-ultraviolet ray of the wavelength region of 380 nm or longer and a near-infrared ray without light leakage. And it does not become yellowish and inferior even when exposed to the near-ultraviolet ray. It has excellent light resistance, heat resistance and weather resistance, has high mechanical strength and chemical stability, and is capable of maintaining a high degree of whiteness. It is easily molded at low cost with high productivity. Further, another object of the present invention is to provide a white color reflecting material that is used as an ink composition for forming a film-shaped white color reflecting material.

A white color reflecting material which is developed to achieve the above mentioned object is characterized in that the formed white color reflecting material comprises a silicone resin or silicone rubber formed from titanium oxide-containing silicone composition, in which anatase-type or rutile-type titanium oxide particles are dispersed.

The white color reflecting material is characterized in that said titanium oxide particles have an average particle size of 0.05 to 50 μm and are contained as 5 to 400 parts by mass in 100 parts by mass of said silicone resin or silicone rubber, and light reflectance thereof is at least not less than 80% thereby.

The white color reflecting material is characterized in that shaped form of the white color reflecting material is a three dimensional, film-like or plate-like shape for reflecting or diffusely reflecting light in the light-condensing or diffusing direction.

The white color reflecting material is characterized in that shaped form of the white color reflecting material is said plate-like or film-like shape on which a conductive metal film is placed for connecting the conductive metal film to a semiconductor optical device comprising a light-emitting component or a solar cell component.

The white color reflecting material is characterized in that a substrate having said film-like shape is placed on said conductive metal film, or said conductive metal film is placed on a substrate having said film-like shape.

The white color reflecting material is characterized in that a support is placed on a surface of said substrate having said film-like shape or said conductive metal film, which the surface is a non-mounted side of a optical component.

The white color reflecting material is characterize in that said conductive metal film is placed on said support, and said substrate having said film-like shape is placed on said conductive metal film.

The white color reflecting material is characterized in that a thickness of said film-like shape is in the range of 5 μm to 2,000 μm.

The white color reflecting material is characterized in that the white color reflecting material is a package molding member which surrounds an optical component comprising a light-emitting component or solar cell component, the package molding member having a three-dimensionally-shaped opening which spreads out wide toward a light-incident or exiting direction and accommodating the optical component therein.

The white color reflecting material is characterized in that a conductive metal film which is connected to said light emitting component is placed on a surface of the white color reflecting material, and a substrate on which the optical component is mounted and said package molding member is bonded or connected through adhesives or a chemical bond.

The white color reflecting material is characterized in that said substrate is made of a silicone resin or a silicone rubber.

The white color reflecting material is characterized in that a support is placed on a surface of said substrate, which the surface is a non-mounted side of an optical component.

The white color reflecting material is characterized in that at least one of a reinforcing material selected from the group consisting of a glass cloth, glass paper and glass fiber is contained in the substrate.

The white color reflecting material is characterized in that a semiconductor light-emitting unit which has said light emitting component or a solar cell which has said solar electron device is integrally placed on said substrate, and a plurality of said package molding members are placed side by side to surround said optical component.

The white color reflecting material is characterized in that said silicone resin or silicone rubber has an active silyl group selected form the group consisting of a hydrosilyl-containing silyl group, a vinyl-containing silyl group, an alkoxysilyl-containing silyl group or a hydrolyzable group-containing silyl group.

The white color reflecting material is characterized in that it comprises a titanium oxide-containing silicone composition to be used for forming a molding, which is comprised of an unvulcanized silicone resin component or silicone rubber component and an anatase-type or rutile type titanium oxide.

A method for producing a white color reflecting material, comprises the steps of;
  performing a surface activation treatment of a surface of a support made of non-silicone resin,
  coating a liquid or fictile titanium oxide-containing silicone composition which comprises a silicone resin or a silicone rubber and anatase-type or rutile-type titanium oxide particles dispersed in the silicone resin or the silicone rubber onto the activation treated surface, and
cross-linking and curing to form a layered body.

The method for producing a white color reflecting material according to claim 17, further comprises a step of;
  providing a metal conductive layer on the cross-linked and cured titanium oxide containing silicone composition layer.

The method for producing a white color reflecting material, comprises steps of;
  providing a metal conductive layer on a support made of non-silicone resin,
  forming a wiring circuit on the metal conductive layer,
  connecting a semiconductor light-emitting component to the wiring circuit, and
  partially providing a liquid or fictile titanium oxide-containing silicone composition, wherein the liquid or fictile titanium oxide-containing silicone composition comprising an anatase- or rutile-type titanium oxide particles dispersed in an unvulcanized silicone resin or silicone rubber at around the semiconductor light-emitting component and then
  cross-linking and curing the composition.

The white color reflecting material made of a titanium oxide-containing silicone of the present invention can sufficiently reflects not only the near-ultraviolet ray of the wavelength region of 380 to 400 nm but also a longer wavelength light in the visible region, further a heat ray such as the infrared region of a longer wavelength of 780 nm or more with high light reflectance and without light leakage. It can be prepared by dispersing anatase-type or rutile-type titanium oxide particles therefor, in particular the anatase-type titanium oxide particles, in the silicone resin or silicone rubber.

In addition, the reflecting material, which exhibits white color and has an excellent hiding property, is made of a hard silicone resin or a soft silicone rubber whose quality is hardly changed under light, heat and chemical action. Accordingly, the reflecting material does not deteriorate and does not become yellowish or brownish even when it is exposed to light from high intensity light-emitting diodes, ultraviolet light-emitting diodes, direct sunlight or high temperatures. Even when it contains anatase-type titanium oxide having a high photocatalytic activity, it exhibits an excellent light resistance, heat resistance and good weather resistance. Moreover, the reflecting material has high mechanical strength and excellent chemical stability, is capable of maintaining a high degree of whiteness, has high durability, and is therefore used as a material for semiconductor light-emitting units or solar cell units, in which semiconductor optical devices are used.

This reflecting material can be precisely, homogeneously, surely and easily mass-produced at low-cost using simple processes without adopting a troublesome surface treatment such as plating to improve light reflection.

The reflecting material can be used not only for light-emitting components but also for general use as reflecting materials of instruments in various fields which relate to semiconductor optical devices such as package molding members or substrates used for photoelectric conversion devices such as solar cell components, etc.

The reflecting material can be used as a white-color reflecting material with high reflectance of light by forming it into a desired shape such as a plate-like, three dimensional or film-like shape. For example, when a film-like reflecting member is formed on a conventional inexpensive member made of a resin such as epoxy resins other than silicone, productivity can be improved and production cost is reduced, and thermal degradation, change of color, etc. of the conventional substrates can be decreased. In this case, on the film-like white color reflecting material placed onto the previously described resin substrate, a conductive metal film is formed using metal foil or metal plating, and then a circuit can be formed using etching method, etc. The obtained member can be used as a circuit board. Further, on the wiring pattern, a semiconductor optical device or an opto semiconductor optical unit is mounted, and the light-emitting component and the circuit is connected, so that an exposed portion of the reflecting material can provide an efficient reflecting surface for light emitted from the light-emitting component.

The reflecting material may be formed into a film-like shape so as to cover the all surface of the base plate comprising a substrate made of the previously known epoxy resins or polyimide resins. Whereas, ink-like reflecting materials may be partially formed into the film-like shape portions as reflecting surfaces on the base plates leaving portions of the other wiring patterns previously formed on the electric base plates being uncovered.

Another embodiment of the reflecting material of the present invention is a composition for forming a white color reflecting film which comprises titanium oxide-containing silicone. The composition can be used as ink to form a thin film, which exhibits an excellent surface smoothness and high reflectance of light, on surfaces of any type, without limitation, of a support using brushing, printing, spraying, dipping, etc. In the case where the thin film is formed, using the methods mentioned above, on the surface or a portion of the surface, where light reflecting function is desired, of the support made of an epoxy resin or bismaleimide-triazine resin whose color is changed into yellowish due to heat. The color itself of the support changes but the deterioration in light reflectivity due to yellowing can be prevented because the surface of the thin film itself does not change in color. When this thin film is formed on the support or the reflector made of ceramics, transparency of ceramics can be intercepted, the light leakage of the emitted light can be prevented, and the amount of reflecting light can be increased.

DETAILED DESCRIPTION OF THE INVENTION

The embodiment of the present invention will be explained below in detail but the scope of the present invention is not limited thereto.

A preferred embodiment of the white color reflecting material made of a titanium oxide-containing silicone of the present invention will be explained in detail with reference to FIG. 1.

Figure 1:
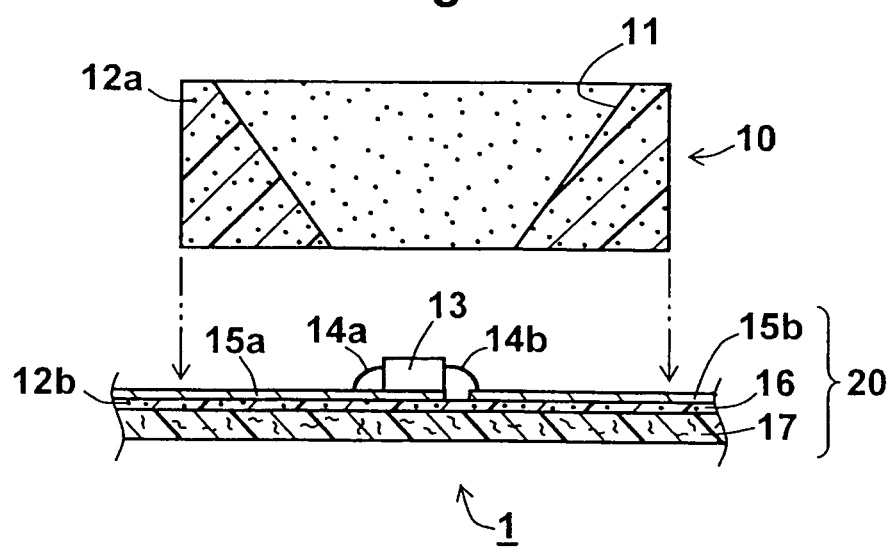
FIG. 1 is a schematic cross-sectional view showing a semi-conductor light-emitting unit using a white color reflecting material of the present invention.

As shown in FIG. 1, the white color reflecting material is built in a semiconductor light-emitting unit 1 and is used as a substrate 16 on which a semiconductor light-emitting component 13 is mounted and also as a package molding member 10 which surrounds the light-emitting component.

The substrate 16 is a member used as a layer on a wiring side of a base plate 20 and is made of a silicone resin that contains a titanium oxide particles 12b. On the surface, of the substrate 16, on the mounting side of the semiconductor light-emitting component 13 as chip, copper layers 15a, 15b which are conductive metal layers and form wiring patterns connecting to a power source (not shown), are placed. Two leads 14a, 14b as wires extending from the light-emitting diode 13 are each connected to the copper layers 15a, 15b respectively. At a portion other than a wiring pattern portion on the surface of the substrate 16, the substrate 16 is exposed to the air. The substrate 16 exhibits white color due to existence of the titanium oxide particles 12b contained therein, and does not let light leak out because of its excellent hiding ability of the white color reflecting material.

On the surface, of the plate-like substrate 16, on the non-mounting side of the semiconductor light-emitting component 13, an insulating support 17, which is a member of the base plate 20, is placed. An opening portion on a light exiting side of a package molding member 10 is sealed by a translucent material, or may be covered, instead of or together with the seal, by a glass or resin transparent plate or film. The seal, transparent plate and film may contain pigment, dye, fluorescent agent, phosphorescence, etc. to change the wavelength of the transmitted light into a desired wavelength. Further, the opening on the light exiting side of the package molding member 10 may be covered by a lens such as a convex lens, concave lens or Fresnel lens (not shown).

The package molding member 10 is also made of a silicone resin containing the same kind of titanium oxide particles 12a as used in the substrate 16. The package molding member 10 surrounds the semiconductor light-emitting component 13 and has an opening that spreads out wide toward the light-exiting direction along an inclined inner wall 11. The package molding member 10 is bonded in one body to the surface of the substrate 16 through adhesive agent layer (not shown), on the mounting side of the semiconductor light-emitting component 13.

Figure 2:
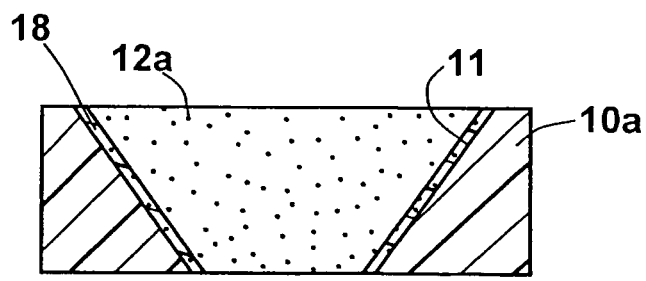
FIG. 2 is a schematic cross-sectional view showing a member (i.e. reflector) of a package molding member using the white color reflecting material of the present invention.

Another embodiment of the package molding member, as shown in FIG. 2, may be a package molding member 10a made of ceramics, which has an opening that spreads out wide toward the light exiting direction, has a coating film 18. The coating film 18 is provided by coating an inner wall of the package molding member 10a with the silicone composition containing an anatase-type or rutile-type titanium oxide powder and a silane coupling agent if desired, and is cured. According to such structure, in addition to an excellent heat resistance and dimensional stability, prevention of light leakage, which is a weak point for ceramic materials, can be improved.

The package molding members 10, 10a have titanium oxide particles 12a as filler. Accordingly, it exhibits a white color and excellent hiding property, so that there is no light leakage, and has extremely high reflectance of light of a wavelength region of 380 nm or longer, especially 400 nm or longer. In addition, the package molding members 10, 10a are made of a silicone resin that is chemically stable and color-fast, so that yellowing does not occur and the white color is maintained even when the members are exposed to near ultraviolet light or high-intensity light for a long period of time. Moreover, it is hard, has high mechanical strength, and has an excellent light resistance, heat resistance and weather resistance, so that it has excellent durability.

The surface of the inner wall 11 of the package molding members 10, 10a made of the white color reflecting material and the surface of the substrate 16 may be subjected to surface treatment through polishing or chemical etching, thereby the reflectance can be further improved.

This kind of semiconductor light-emitting unit 1 may be a lighting appliance in which a plurality sets of the base plates 20 on which the semiconductor light-emitting components 13 are mounted, and the package molding members 10 are orderly arranged in all directions. The semiconductor light-emitting unit 1 with the white color reflecting material of the present invention has extremely high reflectance of not only a near-ultraviolet light especially of the ultraviolet region of wavelength of 380 to 400 nm but also a longer wavelength light of the visible region and a heat ray such as the infrared light in a further longer wavelength region.

The semiconductor light-emitting unit 1 with the white color reflecting material of the present invention is produced as follows.

(1) Production of Copper Foil-Laminated White Color Reflecting Substrate 16:
Preparation of Copper Foils:

A surface of a 12 to 18 μm thick copper foil is subjected to a surface treatment such as a corona discharge treatment, and a plasma treatment under the atmospheric pressure or an ultraviolet treatment to produce a hydroxyl group exposed on the surface of the copper foil after degreasing. Then the surface of the copper foil is immersed into a solution of vinyl-methoxy siloxane homopolymer such as $CH_2=CH-Si(OCH_3)_2-O-[(CH_2=CH-)Si(-OCH_3)-O-]_j-Si(OCH_3)_2-CH=CH_2$ (j is 3 to 4), and heat treated to cause a reaction between the hydroxyl group exposed on the surface of the copper foil and the vinylmethoxy siloxane homopolymer to form a silyl ether and to produce an activated silyl group of a vinyl silyl group-containing silyl group. In order to improve reactivity, the resulted copper foil is immersed into a platinum catalyst suspension so that a vinyl group in the activated silyl group holds the platinum catalyst. Thus the copper foil to be laminated is prepared.

Preparation of a Silicone Composition:

Next, a silicone composition, which contains an unvalcanized silicone resin or silicone rubber component having a hydrosilyl group-containing silyl group and an anatase-type or a rutile-type titanium oxide powder, is prepared. Details will be described later.

The surface of said surface-treated copper foil is coated with said silicone composition using a flow coating method, and then subjected to heat molding and cross linking, so that vinyl of the vinyl silyl group-containing silyl group and hydrosilyl of the hydrosilyl group-containing silyl group are additionally reacted to produce a copper foil-laminated white color reflecting material (i.e. substrate 16) made of titanium oxide-containing silicone.

(2) Formation of Circuit and Connection to the Semiconductor:

Wirings 15a, 15b having a desired wiring pattern are formed at the copper thin film 15 with which is provided by laminating the substrate 16 with the copper thin film 15 and then subjected to a resist and etching processes so as to form the desired circuit. The semiconductor light-emitting component 13 is mounted on a predetermined portion of the wiring pattern. The leads 14a, 14b are connected to the semiconductor light-emitting component and wiring 15a, 15b using ultrasonic welding respectively.

(3) Preparation of Package Molding Member:

The package molding member 10 of the white color reflecting material made of the titanium oxide-containing silicone is formed as follows. A silicone composition comprising a similar unvulcanized silicone resin component as described above, an anatase-type or rutile-type titanium oxide powder and, if needed, a silane coupling agent, is injected into a lower side mold; then the lower side mold is closed with an upper side mold, and then heated to cause cross-linking and curing.

The base plate 20 and the package molding member 10 having much higher mechanical strength can be obtained through the following procedure:

titanium oxide is subjected to a coating treatment with the silane coupling agent;

then the coated titanium oxide is added to a siloxane compound;

the silane coupling agent and the siloxane compound are subjected to heating or light irradiation to cause cross-linking to obtain a silicone resin in which the filler is held between molecules of the binder; and then the obtained silicone resin is molded in a mold, thus obtaining a base plate 20 and a package molding member 10 with much improved physical strength.

(4) Unification of Package Molding Member and Substrate:

The package molding member 10 is disposed so as to take a position with the wider opening portion of the package molding member 10 upward, and to surround the semiconductor light-emitting component 13 without touching the semiconductor light-emitting component 13 and the leads 14a, 14b. Then the package molding member 10 is integrally bonded using adhesives to the substrate 16 which includes a portion of a circuit of the copper foil. After that, the opening of the package molding member 10 is sealed with a silicone transparent resin, thus the semiconductor light-emitting unit 1 is obtained.

Thus obtained semiconductor light-emitting unit 1 is used as follows. When electric current is applied to the semiconductor light-emitting component 13, through negative electrode side copper foil wiring (i.e. copper film) 15a and the lead 14a, and positive electrode side copper foil wiring (i.e. copper film) 15b and the lead 14b, the semiconductor light-emitting component 13 emits light. A portion of the emitted light exits directly outward through the opening on the light exiting direction side of the package molding member 10. Other portion of the emitted light is reflected at the inner wall 11 of the package molding member 10 and also at the exposed portion on the white color reflecting plate other than the wiring pattern of the surface of the substrate 16. Then the other portion of the emitted light is released to the outside world through the opening of the light-exiting direction side.

The white color reflecting material made of the titanium oxide-containing silicone of the present invention includes materials for forming a formed white color reflecting material. In this context, the white color reflecting material may be a liquid, plastic or semisolid state. It is a silicone composition which comprises an unvulcanized silicone resin component or silicone rubber component, powder of anatase-type or rutile-type titanium oxide or both types of titanium oxide, and, if needed, a silane coupling agent (same composition for forming "white color reflecting material", hereinafter may be called simply as "silicone composition"). Such silicone composition, when coated in the form of film on the base plate and cross-linked, can maintain the high reflecting efficiency as well as the whiteness, even if the surface of the base plate which tends to change in color by heat degradation. For example, as shown in FIG. 2, light leakage can be prevented when the silicone composition is coated in the form of film on the reflecting surface of the translucent ceramics reflector.

The present white color reflecting material may be a film-like substrate 16 formed by coating a support 17 made of different material such as aluminum plate with the silicone composition. It may also be the film-like substrate 16 formed into a film sheet, or may be a pasted-together type one in which the substrate 16 is formed into a film sheet and is pasted on the support 17 through an adhesive layer. Furthermore, it may be a 3-layered laminate-type base plate 20 comprising a 2-layered laminate made of the support 17 and the substrate 16, and the conductive metal film (i.e. copper thin film) 15 placed on the surface of the substrate 16. The conductive metal film is used for forming a wiring pattern. Still furthermore, it may be a base plate 20 which comprises: the support 17; the conductive metal film (copper thin film) 15 which is placed on the surface of the support 17 and is used for forming the wiring pattern; and the substrate 16 which is formed, after the wiring pattern is formed, by coating only a portion where reflection function is needed with a silicone composition. As seen above, the thus formed base plate 20, which a laminate is formed by laminating the surface of the substrate 16 or the support 17 with the conductive metal film (copper thin film) such as a copper foil, supplements the weakness in physical properties of the silicone resin and dramatically improves the physical properties of the base plate when compared with the same-thickness base plate 20 that is formed by applying copper foil on the base plate formed with only the white color reflecting material made of the titanium oxide-containing silicone. In particular, the base plate 20 with support 17 supplements the poor bending strength of the silicone resin with rigidity of the support, and surface smoothness of the support is reproduced on the surface of the white color reflecting material, so that the support is preferably used for an electronic circuit base plate.

In these laminated structure, adhesive interfaces between the substrate 16 of the white color reflecting material and the support 17 or the conductive metal film (copper thin film) 15 are solidly bonded together, so that no distortion or peeling occurs.

The thickness of these substrates 16 can be adjusted in concert with the intended use. Commonly, the thickness is in the range of 2 μm to 5 mm, preferably 5 μm to 2,000 μm, more preferably 10 μm to 100 μm. If the substrate is too thin, hiding property becomes insufficient and appropriate light reflectance cannot be attained. On the contrary, if the substrate is too thick, the surface characteristics of the reflecting material cannot be improved so much, and accordingly when mechanical characteristics are not desired, thickness is not so important.

Method for manufacturing the base plate 20 having a film-like substrate 16 will be described in detail with reference to FIG. 3 (A) and FIG. 3 (B).

Figure 3:
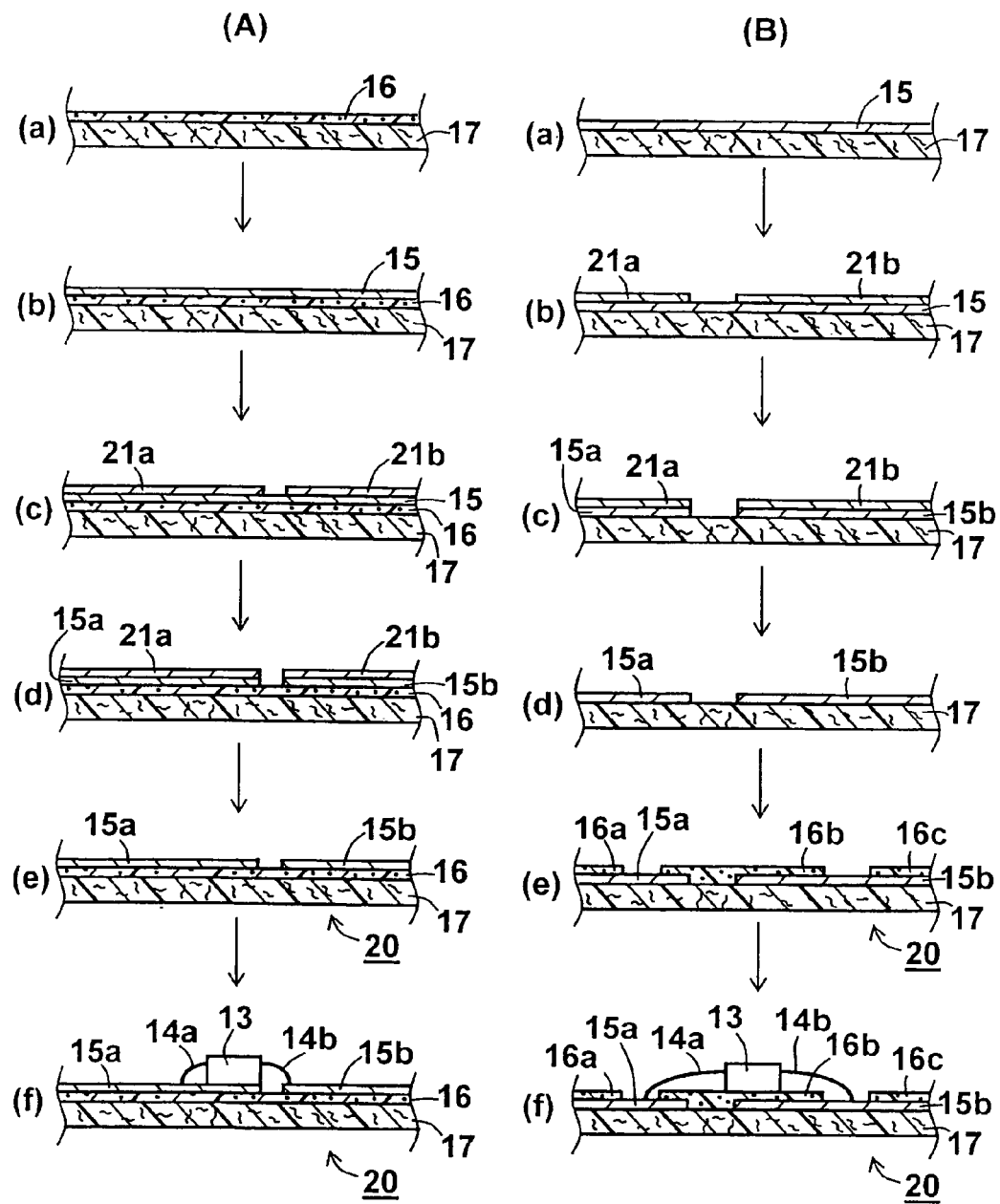
FIG. 3 is a schematic cross-sectional view showing a manufacturing process of a substrate using the white color reflecting material of the present invention.

As shown in FIG. 3 (A), the surface of the support 17 is coated with the composition for forming the white color reflecting film that including the titanium oxide-containing silicone that contains the unvulcanized silicone resin component or silicone rubber component and anatase-type or rutile-type titanium oxide, using a screen printing method, then cross-linked and cured, thus obtaining the substrate 16 (step (a) in FIG. 3(A)). The surface of the substrate 16 is subjected to a surface treatment such as corona discharge treatment, plasma treatment under atmospheric pressure or ultraviolet treatment, to generate a hydroxyl group, then subjected to metal deposition or plating to form the copper thin film 15 of a conductive metal film (step (b) in FIG. 3(A)). The copper thin film 15 is masked to form a masking layer 21a, 21b (step (c) in FIG. 3(A)), then subjected to acid treatment and etching processing to produce the wiring 15a, 15b having a desired wiring pattern (step (d) in FIG. 3 (A)). The masking layers 21a, 21b are removed by dissolution (step (e) in FIG. 3 (A)). Then the leads 14a, 14b extending from the semiconductor light-emitting component 13 is connected to the wiring 15a, 15b (step (f) in FIG. 3 (A)). At a portion other than the wiring pattern portion, the substrate 16 showing high reflectance is exposed to the air.

As shown in FIG. 3 (B), a conductive metal film (i.e. copper foil), which is previously subjected to degreasing and then to surface treatment such as corona discharge treatment or plasma treatment under atmospheric pressure or ultraviolet treatment, is subjected to a process of bonding to the surface of the support 17; or the surface of the support 17 is subjected to a plating process; to form a copper thin film 15 of a conductive metal film (step (a) in FIG. 3 (B)). The conductive metal film 15 is masked to form a masking layer 21a, 21b (step (b) in FIG. 3 (B)), then subjected to acid treatment and etching processing to form the wiring 15a, 15b having a desired wiring pattern (step (c) in FIG. 3 (B)). The masking layer 21a, 21b are removed by dissolution (step (d) in FIG. 3 (B)). A portion other than the portion of the wiring pattern which is connected to leads 14a, 14b extended from the semiconductor light-emitting component 13 is coated using screen printing method; with the composition for forming the white color reflecting film made of the titanium oxide-containing silicone that comprises the unvulcanized silicone resin component or silicone rubber component, anatase-type or rutile-type titanium oxide; to form the substrate (i.e. coated film) 16a, 16b, 16c (step (e) in FIG. 3 (B)). The semiconductor light-emitting component 13 is mounted on a desired substrate (i.e. coated film) 16b, and said semiconductor light-emitting component 13 is connected to the wirings 15a, 15b through the leads 14a, 14b using ultrasonic wave welding (step (f) in FIG. 3 (B)). Thus, light emitted from the semiconductor light-emitting component 13 is reflected by the substrate (i.e. coated film).

Figure 4:
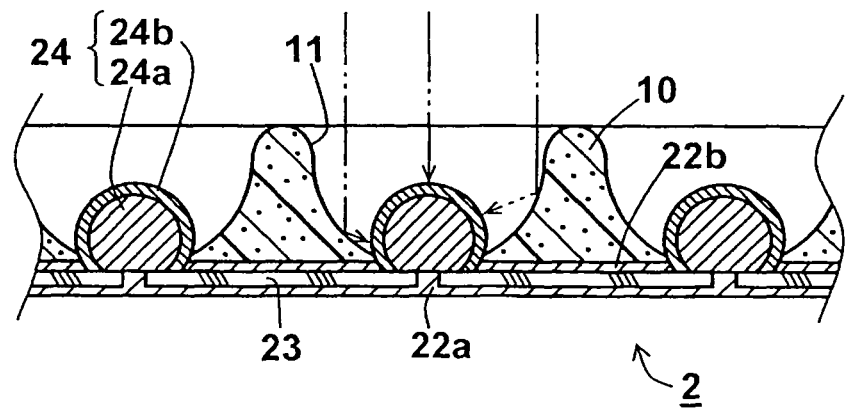
FIG. 4 is a schematic cross-sectional view showing a solar cell using the white color reflecting material of the present invention.

In another embodiment of the white color reflecting material, as shown in FIG. 4, the white color reflecting material is incorporated as an assembly of a solar cell 2. And the white color reflecting material is also used for the package molding member 10 on which a photoelectric conversion device of a solar cell component 24 is mounted.

The package molding member 10 comprises a silicone resin which contains titanium oxide particles 12a and is formed into a plurality of bowl-shaped concaves which are arranged side by side to make multiple lines. The solar cell component 24 comprises a ball-like p-type silicone semiconductor 24a located inside of the ball, and an n-type silicone semiconductor 24b covering the p-type silicone semiconductor and forming P-N junction. A lower end portion of the n-type silicone semiconductor 24b is missing due to a grinding operation. At this missing portion, the p-type silicone semiconductor 24a is exposed. The n-type silicone semiconductor 24b is connected only to a copper film 22b of an electrode element layer of a negative electrode, and on the other hand, the p-type silicone semiconductor 24a is connected only to a copper film 22a, which is an electrode element layer of a positive electrode. The copper films 22a, 22b, which are the two electrodes, are separated and insulated from each other by an insulator layer 23 placed between the two copper films. The package molding member 10: surrounds the solar cell component 24; and has an opening that is shaped into the bowl-shaped concave inner wall 11 and spreads out wide toward a light-exiting direction. The package molding member 10 is integrally bonded to the copper film 22b through an adhesive layer (not shown).

The surface of the inner wall 11 of the package molding member 10 may be subjected to a surface treatment to improve adhesiveness to a silicone-type sealing resin. Specifically, the bonding method previously described in "(1)-production of copper foil-laminated white color reflecting substrate 16" can be utilized.

The present package molding member 10 and the solar cell assembly 2 using the same are manufactured as follows. A composition for forming a silicone molding which contains a silicone resin component, an anatase-type or rutile-type titanium oxide powder and if desired a silane coupling agent, is cured in a mold to manufacture the package molding member 10 having bowl-shaped concaves in all directions at regular intervals. At the bottom of the bowl-like concave, a hole is bored. At a position of an insulator corresponding to the hole at the bottom of the bowl-like concave, a hole is bored. A copper film 22a is bonded to the rear surface of the insulator and is exposed to the air through a conductive material filled in the hole of the insulator. The copper film 22b is bonded to the upper surface of the insulator and then subjected to etching processing to form a wiring pattern. The hole at the bottom of the bowl-like concave of the package molding member 10 and the copper film 22a exposed from the hole of the insulator 23 are made aligned, and the package molding member 10 is bonded to the copper film 22b such that the copper film 22b is covered by the package molding member 10. On the other hand, a silicone ball is produced by forming a thin film made of n-type silicon crystal so as to wrap around the ball-like p-type silicon crystal. A portion of the silicone ball is evenly ground to cause a missing portion at the outer periphery of the ball made of n-type silicone semiconductor 24b, and the p-type silicone semiconductor 24a that resides inside the ball is exposed to the air through the missing portion. The exposed portion of the p-type silicone semiconductor 24a is brought into contact with the copper film 22a exposed through the hole of the insulator 23. When the n-type silicone semiconductor 24b is brought into contact and then bonded and fixed only to the copper film 22b which is also used as a negative electrode. Then the solar cell assembly 2 is obtained.

The solar cell assembly 2 using the white color reflecting material of the present invention can be used as follows. As shown in FIG. 4, light, for example, sunlight enters the solar cell component 24 of the solar cell assembly 2. For example, incident sun light from directly above falls straightly on an apex of the solar cell component 24. Incident sun light that is somewhat outside of the incident sun light from directly above, is reflected at the inner wall 11 of the package molding member 10 and then falls somewhat vertically on a side surface of the solar cell component 24. In this way, light that falls on the solar cell assembly 2 efficiently reaches a P-N junction interface between the n-type silicone semiconductor 24b and the p-type silicone semiconductor 24a, generating a photovoltaic force, and when a circuit is set up, a photocurrent flows.

When the package molding member 10 used for the solar cell assembly 2 is made of materials, such as ceramics, etc., other than the white color reflecting material made of the titanium oxide-containing silicone, the surface of the package molding member 10 can be covered with the white color reflecting material of the present invention, and light can be reflected in a light condensing direction.

Materials used for the white color reflecting material of the present invention are described below. The silicone composition for forming the white color reflecting film or the white color reflecting material with a desired shape in which anatase-type or rutile-type titanium oxide is dispersed in the unvulcanized silicone resin or silicone rubber, is heat-curable and has an excellent heat resistance, durability and light resistance. The silicone composition, whose viscosity can be arbitrarily adjusted by adding solvents or additives, can be formed into a coating film having a desired thickness without dripping and also into a molding having a desired shape. This titanium oxide containing silicone composition comprises an unvulcanized silicone resin component or silicone rubber component, so that this composition has excellent storage stability when compared with a conventional light-curing resists and can be used by adding a diluent when the composition remains unused. As the diluent, ZEORORA (Trade name, fluorinated solvent produced by Asahi Glass Co.), xylene, toluene, ether, thinner, 1-bromopropane, etc. can be exemplified. Low viscosity silicone thinner which can be made into a cured silicone material through a chemical reaction, can be used. In particular, thinner is easily available and does not increase its viscosity, so that it is excellent in workability, being preferable.

In the silicone composition of the present invention, anatase-type or rutile-type titanium oxide is added preferably in an amount of 5 to 400 parts by mass per 100 parts by mass of an unvulcanized silicone resin or silicone rubber component. If added less than 5 parts by mass, the white color reflecting material formed from this silicone composition of the present invention shows insufficient reflection, in particular, reflectance of light in the long wavelength region decreases, whereas, if added more than 400 parts by mass, dispersion of titanium oxide becomes difficult.

Closest packing, in which an additive amount of titanium oxide can be increased, can be achieved by using a small and large particle size anatase- or rutile-type titanium oxide together. Use of a large size particle of titanium oxide makes it possible to increase the hiding ability. It is preferable that the average particle size is in the range of 0.05 to 50 µm. If the particle size is less than 0.05 µm, the hiding ability tends to decrease. On the other hand, if the particle size is more than 50 µm, the coating condition of the composition becomes unstable and surface qualities after coating become unstable. There is no limitation on the shape of titanium oxide particles. Particles with any shape such as flake-like shape, amorphous form or ball-like shape can be used. It is preferable that the particle size is in the range of 0.1 to 10 µm. Titanium oxide whose surface is treated with $Al_2O_3$, $ZrO_2$, or $SiO_2$ etc., can be used. Anatase-type titanium oxide has strong photocatalytic actions, therefore said surface treatment is recommended.

For the reflection of light in the visible region, rutile-type titanium oxide is preferably used. For the reflection of light in the wavelength region of 380 to 400 nm, anatase-type titanium oxide is preferably used. In particular, anatase-type titanium oxide is preferably used and can sufficiently reflects light in not only the wavelength region of 380 to 400 nm but also the visible region light of a longer wavelength and a heat ray such as the infrared region of a further longer wavelength of 780 nm or more.

Anatase-type or rutile-type titanium oxide is added into 100 parts by mass of silicone, preferably in an amount of 5 to 400 parts by mass, more preferably 10 to 200 parts by mass. If the titanium oxide is added in less than 5 parts by mass, hiding ability becomes insufficient and light reflectance cannot be secured. If the titanium oxide is added more than 400 parts by mass, coating process becomes difficult to perform.

The anatase-type titanium oxide powder behaves as a strong photo-decomposing catalyst having an ability to decompose adhered substances such as dust, so that when it is added into polymeric compounds of thermoplastic resins such as polycarbonate, polyphthalimide, polyether ether ketone, etc., it even causes decomposition, yellowing, degradation and cracking of these polymers. However, silicone resin is chemically stable to anatase-type titanium oxide, and accordingly, the white color reflecting material does not show any changes in its quality and shape for a long period of use.

Figure 5:
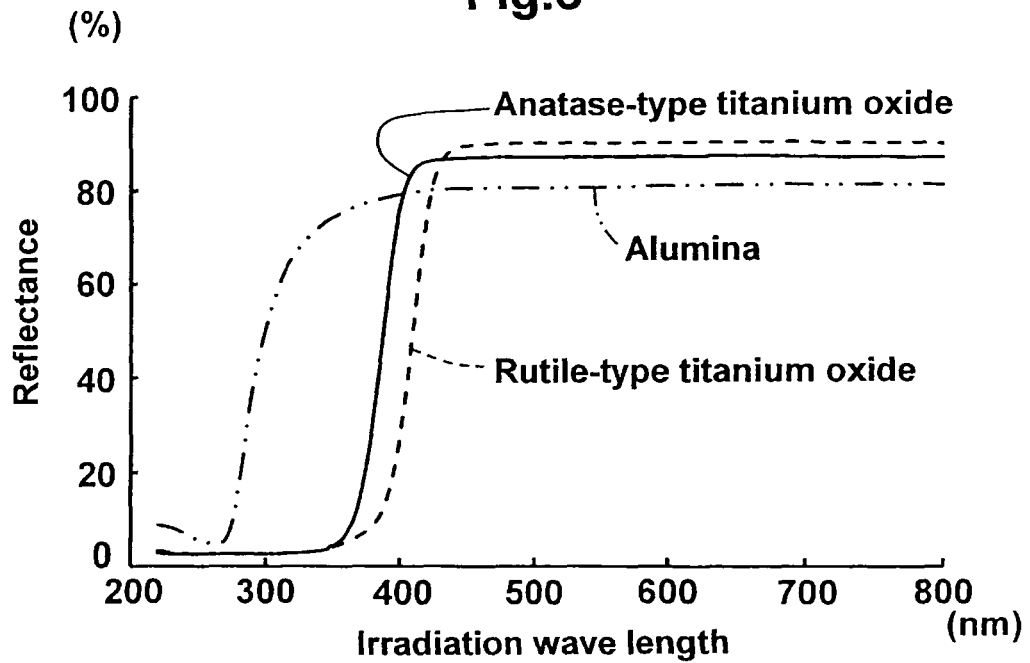
FIG. 5 is a graph showing a relationship between irradiation wavelength and light reflectance of an anatase-type titanium oxide-containing silicone white color reflecting material and a rutile-type titanium oxide-containing silicone white color reflecting material of the present invention and an alumina-containing white color reflecting material which is outside the present invention.

FIG. 5 shows a relationship between an irradiation wavelength and light reflectance of 30 µm-thick white color reflecting films containing a silicone and 10% by mass of a powder of anatase-type titanium oxide, rutile-type titanium oxide or alumina respectively. As clearly seen from FIG. 5, the value of reflectance of the rutile-type titanium oxide-containing film is only 30% at the wavelength of 400 nm, but that of the anatase-type titanium oxide-containing film is more than 80%. The anatase-type titanium oxide-containing film shows a higher value of reflectance than that of the rutile-type titanium oxide-containing film especially at the wavelength of 380 to 420 nm. On the other hand, the light reflectance of an alumina-containing reflecting film increases at around 300 nm, but the light reflectance of a long wavelength of 380 nm or over is in the level of 80% at a maximum, being far inferior when compared with the anatase-type or rutile-type titanium oxide-containing film.

The refractive index of anatase-type titanium oxide and rutile-type titanium oxide is 2.45 to 2.55 and 2.61 to 2.90 respectively, while that of alumina is about 1.76. When compared with alumina, anatase-type titanium oxide has high refractive index as well as rutile-type titanium oxide, and accordingly anatase-type titanium oxide has high value of light reflectance.

Inorganic white pigments such as alumina, barium sulfate, magnesia, aluminum nitride, boron nitride (hexagonal crystal or cubical crystal), silica (crystalline silica or molten silica), barium titanate, kaolin, talc, powdered aluminum may be arbitrarily added together with titanium oxide in concert with an intended use for such as heat dissipation, ultraviolet light reflection, etc. Even when maximum dispersible amount of inorganic white color pigment such as alumina or barium sulfate is solely added into silicone, light leakage is observed. However, when such inorganic white pigment is used together with titanium oxide, light leakage disappears and light reflectance increases, and functions such as heat dissipation, ultraviolet ray reflection, etc. are preferably improved.

The kind of the silicone resin or silicone rubber which is used for the white color reflecting material of the present invention, is not specifically limited, so that a hard silicone resin, a soft silicone resin, a hard silicone rubber and a soft silicone rubber can be utilized. As an example, polysiloxane compound, which is exemplified by poly(dialkyl siloxane) such as poly(dimethl siloxane), poly(diaryl siloxane) such as poly(diphenyl siloxane), etc., can be used.

Among these silicones, dimethyl silicone with a low refractive index is preferably utilized and the light reflectance thereof can be improved thereby. Dimethyl silicone contains few or no phenyl group that causes yellowing, so that heat resistance and ultraviolet resistance can be improved, too, when dimethyl silicone is used.

On the other hand, a phenyl group-containing phenyl silicone can increase the hardness of material, so that it is preferably used for hard white color reflecting material.

Such silicones may be three-dimensionally cross-linkable silicones. This three dimensionally cross-linkable polysiloxane compound has a Si group such as an alkyloxy silyl group or dialkyloxy silyl group, vinylsilyl group or divinyl silyl group, and hydosilyl group or dihydrosilyl group. A plurality of such groups may exist in the silicone. And accordingly the silicone can cross-link to form a three-dimensional network. A pair of siloxane compounds or a combination of a siloxane compound and a silane coupling agent that is, if needed, added, are cross-linked with each other through a dealcoholization condensation reaction between alkyloxysilyl groups or between dialkyloxysilyl groups, or are cross-linked through solvent-free addition reaction between vinylsilyl group or divinylsilyl group and hydrosilyl group or dihydrosilyl group under the presence of a platinum catalyst such as a platinum complex by heating or light irradiation. As the siloxane compound, a polysiloxane compound that can cross-link through addition reaction is preferable. A siloxane compound having a repeating unit such as diphenylsyloxy group (—Si($C_6H_5$)$_2$—O—) or dimethylsiloxy group (—Si($CH_3$)$_2$—O—) may be used. As the siloxane compound, a polysiloxan compound that has a repeating unit of dimethylsiloxy group and also has an alkyloxysilyl group, dialkyloxysilyl group, vinylsilyl group, divinylsilyl group, hydrosilyl group or dihydrosilyl group, is stable against the change in color and therefore is more preferable.

Such silicones mentioned above have rubber elasticity over a broad range of temperature of from −40° C. to +200° C. Therefore, when the support is laminated with them, the silicones can follow a dimensional change of the support generated by the heat expansion and contraction caused by the temperature of the support, thus being able to eliminate one of causes that may lower the light reflectance.

Ceramic coating has excellent heat resistance, but cannot follow heat expansion and contraction of the support, and accordingly ceramic coating causes generation of cracks and deterioration in the value of reflectance.

Silicone rubber can maintain a high reflectance of light for a long period of time, since its rubber elasticity and heat resistance are sufficient. Phenyl silicone of a hard silicone resin has characteristics of decreasing its hardness at high temperatures, thus being able to fully respond to a linear expansion of the support.

Rubber hardness is preferably in the Shore A hardness range of 30 to 90 and in the Shore D hardness range of 5 to 80.

As a printing method of the titanium oxide-containing silicone composition for forming the film-like white color reflecting material, screen printing, PAD printing, offset printing, gravure printing, anastatic printing, etc. can be exemplified. As coating methods, ink-jet methods, dispenser methods, spray methods, roller methods, blade coating, air nozzle coating, dip coating, bar coating, etc. can be exemplified. Screen printing methods, in which white color reflecting films can be formed in concert with a desired circuit board wiring pattern, is more preferable because silk screens and metal masks can be utilized.

As a silane coupling agent in the present invention, which is used if desired, an agent having a reactive functional group such as an alkyloxy group, a vinyl group, an amino group, an epoxy group, etc. can be exemplified. As coupling agents, titanate and aluminate coupling agents as well as silane coupling agents are preferably used.

When silane coupling agents are contained in the siloxane compounds, titanium oxide can be surely taken into the network structure, being able to extremely improve the physical strength of the silicone resin, in comparison with the siloxane compounds with no silane coupling agents.

In particular, the white color reflecting material made of silicone that contains silane coupling agent-treated titanium oxide shows improved bending strength, wettability and dispersibility and is of high quality, because titanium oxide is cross-linked with silicone through the silane coupling agent. Such silane coupling treatment is carried out, for example, by adding 1% by mass of the silane coupling agent into titanium oxide, stirring by Henschel mixer, and then by drying at 100 to 130° C. for 30 to 90 minutes.

As a forming method other than the coating method of the white color reflecting material of the present invention, forming can be carried out using compression molding, injection molding, transfer molding, liquid silicone rubber injection molding (LIMS), extrusion molding, calendar molding, etc.

As adhesives in the present invention, which are used between the package molding member 10 and the substrate 16 or the package molding member 10 and the conductive metal film such as the copper film 15a, 15b, 22a, and 22b, SE9185 (trade name, produced by Dow Corning Toray Co. Ltd.) and SE9186 (trade name, produced by Dow Corning Toray Co. Ltd.) can be exemplified.

In the laminate of the present invention comprising a conductive metal film layer such as copper foil, a package molding member, a film-like or plate-like white color reflecting substrate and a support, lamination can be carried out by utilizing the above-mentioned adhesives, as well as chemical bonding, after joining surfaces being activated by surface treatment.

More specifically, the adhesion through surface treatment is carried out as follows. The surface of the metal foil is degreased, and then the surface is treated by a corona discharge treatment, plasma treatment under atmospheric pressure or ultraviolet treatment, to generate hydroxide groups exposed to the air on the surface of the metal foil. The surface of the metal foil is immersed into a solution of vinylmethoxy siloxane homopolymer such as $CH_2$=CH—Si($OCH_3$)$_2$—O—[($CH_2$=CH—) Si(—$OCH_3$)—O—]$_j$—Si($OCH_3$)$_2$—CH=$CH_2$ (j is 3 to 4), and is heat treated to react the hydroxyl groups produced on the surface of metal foil with vinylmethoxy siloxane homopolymer, producing silyl ether and producing a vinylsilyl group-containing silyl group or an activated silyl group. Next, in order to improve reactivity, the resulted foil is immersed into platinum catalyst-suspending liquid to make a vinyl group in the activated silyl group hold the platinum catalyst. Then the silicone resin component or silicone rubber component having the hydrosilyl group-containing silyl group is placed on the surface of the metal foil which is already surface-treated with the silicone material composition containing anatase-type titanium oxide, and then they are heated and cured. Addition reaction occurs between vinyl in the vinylsilyl group-containing silyl group and hydrosilyl in the hydrosilyl group-containing silyl; as a result, the metal foil and the white color reflecting material are surely bonded through strong chemical bonding.

In the foregoing examples, vinylmethoxy siloxan homopolymer having a vinyl group as an active group is bonded to a metal film, and the silicone composition containing a hydrosilyl group- and silyl group-containing silicone rubber composition having a hydrosilyl group as a reactive group is used. The active group may be an active silyl group such as a hydrosilyl-containing silyl group, vinyl-containing silyl group, alkoxysilyl-containing silyl group or hydrolyzable group-containing silyl group. And the reactive group in said silicone rubber component or said silicone resin component may be a reactive silyl group such as a hydrosilyl group-containing silyl group, vinylsilyl group-containing silyl group, alkoxysilyl-containing silyl group or hydralyzable group-containing silyl group. As for the combination of the active group and the reactive group, when one of them is a hydrosilyl-containing silyl group, the other is a vinylsilyl group-containing silyl group. When one of them is an alkoxysilyl-containing silyl group, the other is an alkoxysilyl-containing group or hydrolyzable group-containing silyl group, that is, all groups are hydrolyzable group-containing silyl groups.

All these active silyl groups are produced by reacting hydroxyl groups on the surface of a metal film with alkoxysilyl groups of a functional alkoxysilyl compound.

Examples of the white color reflecting material that is used for light-emitting diode packages or solar cell assemblies are shown above, but the white color reflecting material may be used as light- and heat ray-reflecting base plates such as semiconductor device base plates, integrated circuit base plates, high-frequency wave base plates, electric circuit base plates, solar cell base plates, etc. These reflecting materials may be integrated into a case or housing as one unit.

As the plating process for forming a conductive metal film of the present invention, nickel plating, copper plating, silver plating, gold plating, chromium plating, vanadium plating, etc. can be exemplified. These plating processes are preferably combined together to form the conductive metal film.

The material of the support 17 is not particularly limited, but following materials such as ceramics, bismaleimide-triazine resin, glass, metallic aluminum, paper phenol resin, bakelite, glass fiber-containing epoxy resin, polytetrafluoroethylene, paper epoxy, polyamide, polyimide, silicone resin and silicone rubber can be exemplified. A support blended of the above-mentioned material and a reinforcing material selected from the group consisting of a glass cloth, glass paper and glass fiber, can also be exemplified.

EXAMPLES

Examples, in which the white color reflecting materials made of the titanium oxide-containing silicones were experimentally manufactured and were mounted on semiconductor light-emitting units, are described below.

Example 1

10 parts by mass of anatase-type titanium oxide (trade name SA-1 produced by Sakai Chemical Industry Co., Ltd.) was dispersed in 100 parts by mass of a silicone resin (trade name SR-7010 produced by Dow Corning Toray Co. Ltd.). A white color reflecting plate measuring 70 mm long, 50 mm wide and 1 mm thickness was manufactured using a heat press at 170° C. for 5 minutes. After that, it was annealed at 170° C. for 90 minutes, thus obtaining test samples. Light reflectance was measured after heat aging at 150° C. for 1,000 hours, using a spectrophotometer UV-3150 (produced by Shimadzu Corporation). Light reflectance was measured at three wavelengths (380 nm, 550 nm and 780 nm). The results are combined together and shown in Table 1.

TABLE 1

| | Reflectance (%), before heat aging | | | Reflectance (%), after heat aging | | |
|---|---|---|---|---|---|---|
| | 400 nm | 550 nm | 780 nm | 400 nm | 550 nm | 780 nm |
| Ex. 1 | 82 | 91 | 90 | 77 | 90 | 91 |

[Evaluation of Light Reflectance after Heat Aging at High Temperature]

As clearly seen from Table 1, there was no significant deterioration in light reflectance even after 1,000-hour heat aging, and no yellowing and degradation was observed. It had excellent heat and light resistance. It was found that this is a useful reflecting material.

Example 2 and Comparative Example 1

100 parts by mass of rutile-type titanium oxide (trade name SR-1, produced by Sakai Chemical Industry Co., Ltd.) was added into each of 100 parts by mass of bismaleimide-triazine resin (BT resin) and 100 parts by mass of glass epoxy resin (GE resin), and dispersed and molded to produce each base plate measuring 50 μm thick. On the other hand, bismaleimide-triazine resin substrate and glass epoxy resin substrate measuring 25 μm thickness were obtained in the same manner as described above.

The 25 μm-thick substrates (BT resin substrate, GE resin substrate) were laminated, using a bar coater-coating method, with a silicone composition in which 100 parts by mass of rutile-type titanium oxide (trade name SR-1 produced by Sakai Chemical Industry Co., Ltd.) was added into the silicone resin used in Example 1, thus obtaining a 50 μm-thick white-color reflecting plate having a 25 μm-thick silicone resin composition-coated film.

These four kinds of white-color reflecting plates were evaluated in the same way as described in Example 1. Light reflectance was measured over the wavelength range of 200 nm to 1,000 nm.

Figure 6:
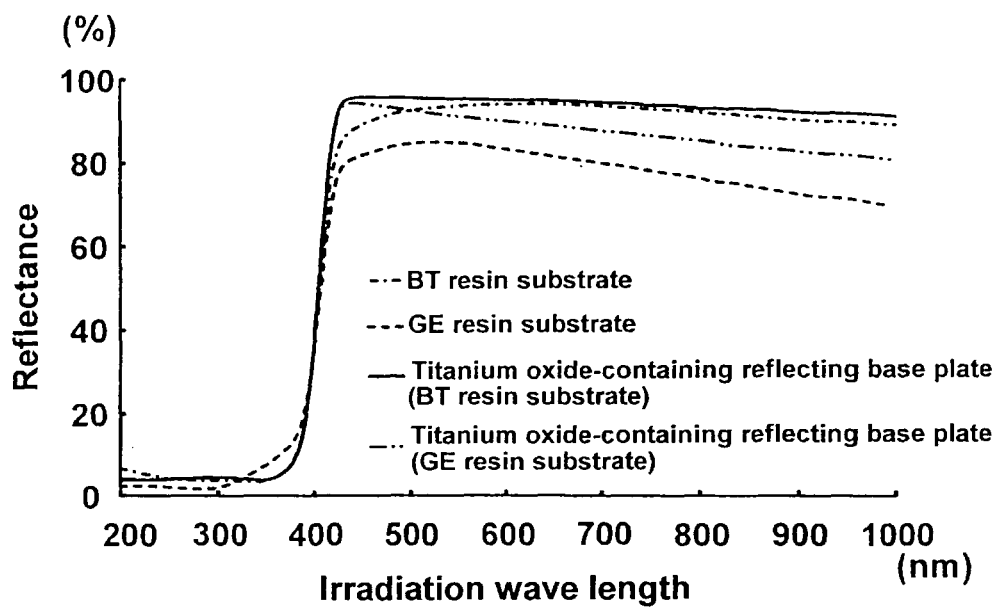
FIG. 6 is a graph showing a relationship between an irradiation wavelength and light reflectance of a coating-type substrate made of the white color reflecting material of the present invention, and coating-type substrates made of bismaleimide-triazine resin and made of a glass epoxy resin both of which are outside the present invention.
Figure 7:
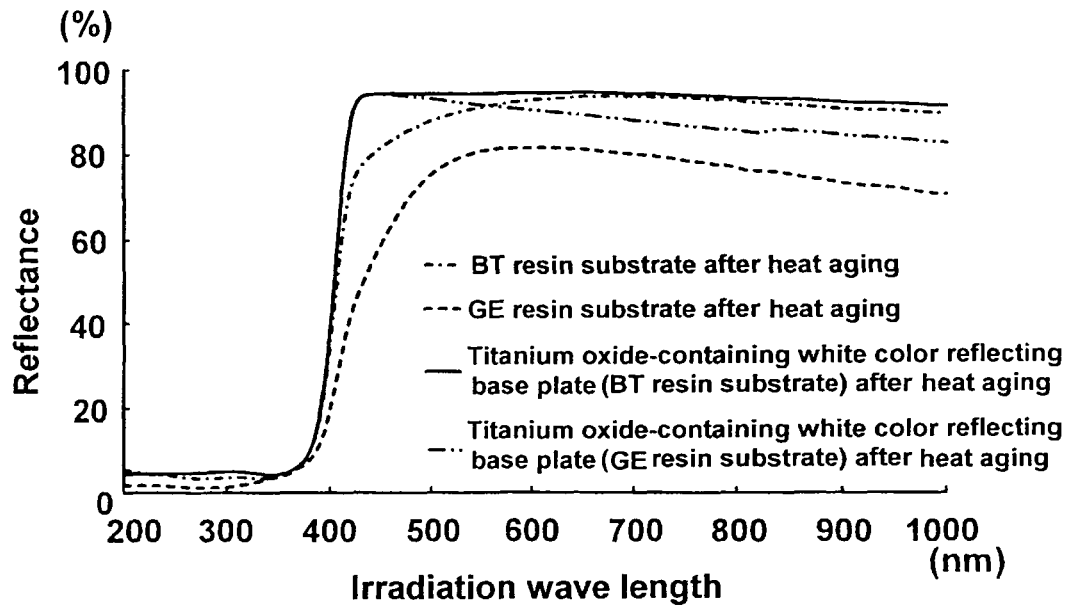
FIG. 7 is a graph showing a relationship between irradiation wavelength and light reflectance, after heat aging, of a coating-type substrate made of the white color reflecting material of the present invention and a coating-type substrate made of bismaleimide-triazine resin and glass epoxy resin both of which are outside the present invention.

The results of the light reflectance obtained before heat aging are shown in FIG. 6 and the light reflectance obtained after heat aging is shown in FIG. 7.

[Comparative Evaluation Between Conventional Base Plate and White Color Reflecting Plate of the Present Invention after Heat Aging at High Temperature]

From FIGS. 6 and 7, it was found that light reflectance of the BT resin substrate and GE resin substrate was improved by coating each of the BT and GE resin substrates with the composition for forming the white color reflecting film which was made of titanium oxide-containing silicone. Further, it was also found that the laminate-type white color reflecting materials, which were made by coating the resin substrates with the composition for forming the white color reflecting film which was made of titanium oxide-containing silicone, can maintain high reflectance of light even after heat aging.

Example 3

Figure 8:
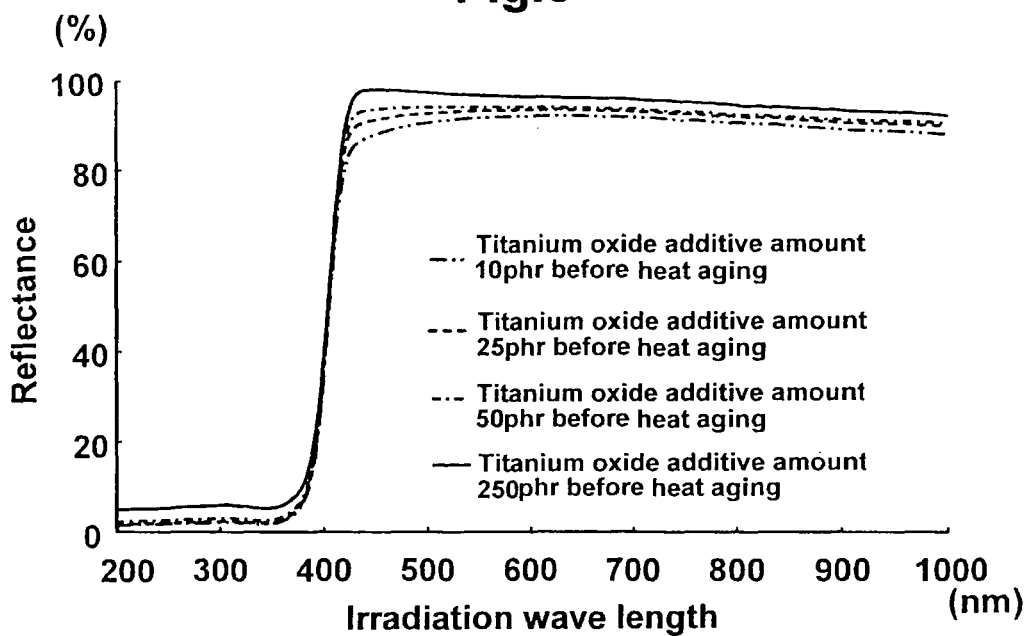
FIG. 8 is a graph showing a relationship between an irradiation wavelength and light reflectance of the present base plate having a coating-type film made of the white color reflecting material which is formed on the substrate made of bismaleimide-triazine resin.
Figure 9:
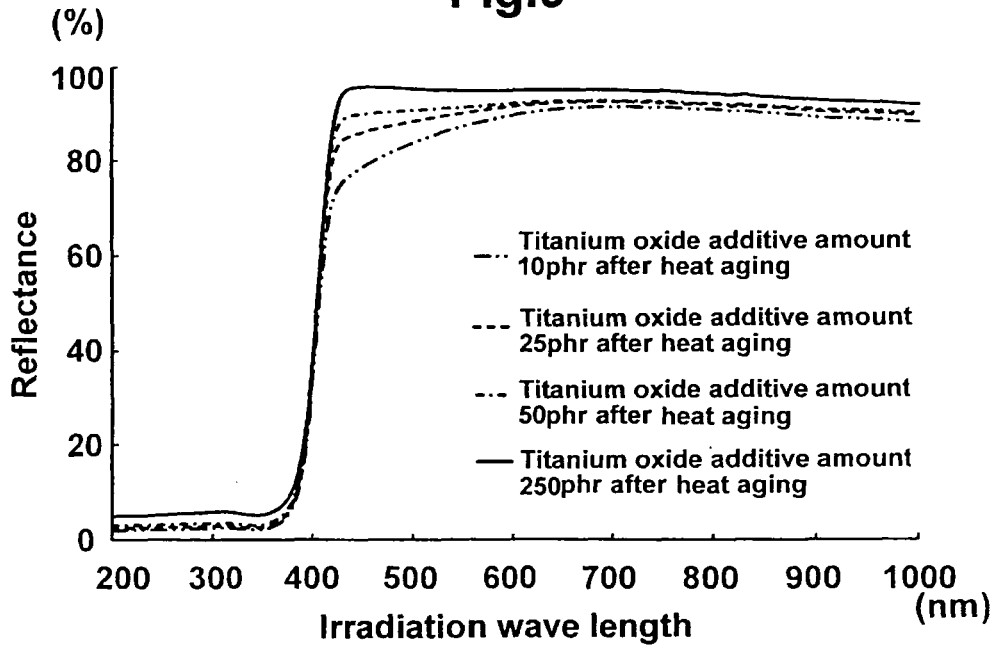
FIG. 9 is a graph showing a relationship between an irradiation wavelength and light reflectance of the present base plate having a coating-type film made of the white color reflecting material which is formed on the substrate made of bismaleimide-triazine resin, after heat aging.

25 μm-thick BT resin substrates, which were prepared in the same manner as described in Example 2, were coated respectively with the titanium oxide-containing silicone composition in which 10 parts by mass (phr), 25 phr, 50 phr or 250 phr of rutile-type titanium oxide was added respectively into 100 parts by mass of silicone resin, so as to prepare 25 μm-thick films, thereby obtaining 50 μm-thick laminate-type white color reflecting materials. Light reflectance was measured in the same manner as described in Example 2 and the correlationship between irradiation wavelength and light reflectance is shown in FIG. 8. The heat aging and light reflectance measurement were carried out in the same manner as described in Example 2 and correlationship between irradiation wavelength and light reflectance is shown in FIG. 9.

[Evaluation of Light Reflectance in Relation to an Additive Amount of Rutile-Type Titanium Oxide Dispersed in the 25 μm-Thick Coating Film on the BT Resin Substrate of a Laminate-Type White Color Reflecting Plate, and Comparative Evaluation of Light Reflectance after Heat Aging]

From FIG. 8, it was found that the laminate-type white color reflecting substrate formed by adding and dispersing 10 phr of rutile-type titanium oxide has a reflectance value of 90% or over. From FIG. 9, given the change over time caused by heat aging, 25 phr or more rutile-type titanium oxide is needed to secure the reflectance value of 80%. From this, preferably 10 phr or more, and more preferably 25 phr or more of the rutile-type titanium oxide is needed, when considering the change over time caused by heat aging.

Example 4

Figure 10:
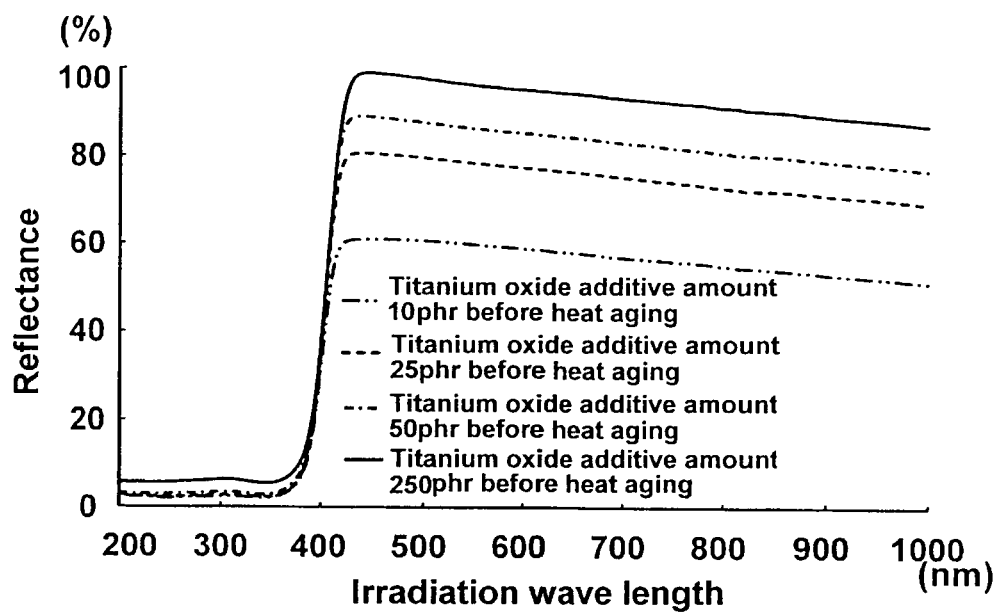
FIG. 10 is a graph showing a relationship between an irradiation wavelength and light reflectance of the present base plate having a coating-type film made of the white color reflecting material which is formed on the substrate made of glass epoxy resin.
Figure 11:
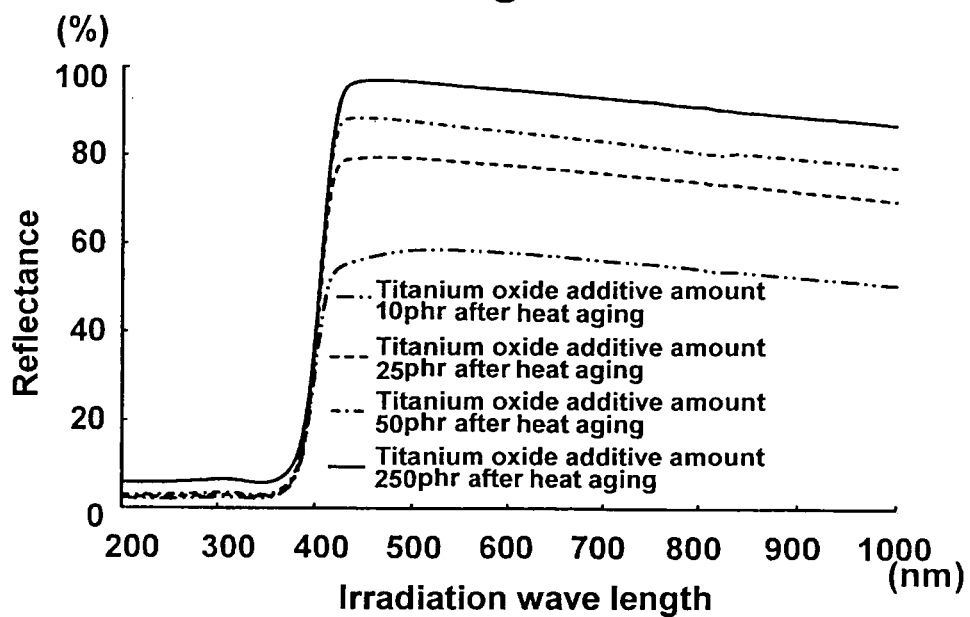
FIG. 11 is a graph showing a relationship between an irradiation wavelength and light reflectance of the present base plate having a coating-type film made of the white color reflecting material which is formed on the substrate made of glass epoxy resin, after heat aging.
Figure 12:
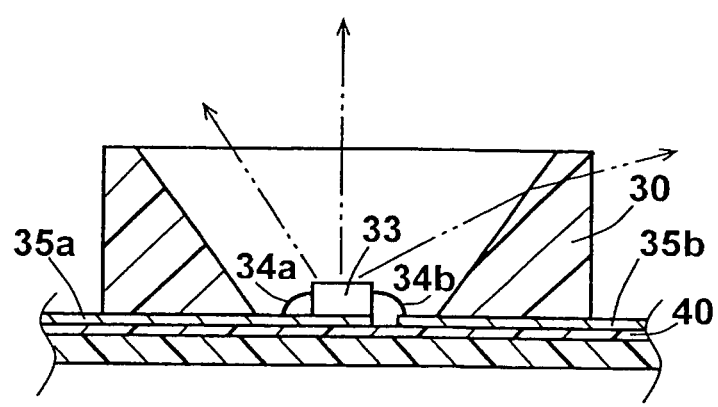
FIG. 12 is a schematic cross-sectional view showing a conventional semiconductor light-emitting component with a reflecting material that is outside the present invention.

25 μm-thick GE resin substrates, which were formed in the same manner as described in Example 2, were coated with a titanium oxide-containing silicone composition in which an additive amount of 10 parts by mass (phr), 25 phr, 50 phr or 250 phr of rutile-type titanium oxide were respectively added into 100 parts by mass of silicone resin, so as to prepare 25 μm-thick films, thereby obtaining 50 μm-thick laminate-type white color reflecting materials. Light reflectance was measured in the same manner as described in Example 2 and the correlationship between irradiation wavelength and light reflectance is shown in FIG. 10. Heat aging and light reflectance measurement were carried out in the same manner as described in Example 2 and correlationship between irradiation wavelength and light reflectance is shown in FIG. 11.

FIG. 10 shows correlationship between irradiation wavelength and light reflectance of 25 μm-thick base plates which were formed by coating the GE resin substrates with a composition for forming a white color reflecting film made of titanium oxide-containing silicone into which an amount of 10 phr, 25 phr, 50 phr or 250 phr rutile-type titanium oxide was added respectively. FIG. 11 shows correlationship, after heat aging, between irradiation wavelength and light reflectance of 25 μm-thick base plates which were formed by coating the GE resin substrates with a composition for forming a white color reflecting film made of titanium oxide-containing silicone into which an amount of 10 phr, 25 phr, 50 phr or 250 phr rutile-type titanium oxide was added respectively.

[Evaluation of Light Reflectance in Relation to an Additive Amount of Rutile-Type Titanium Oxide in a 25 μm-Thick Coating Film on the BT Resin Substrate of a Laminate-Type White Color Reflecting Plate, and Comparative Evaluation of Light Reflectance after Heat Aging]

From FIG. 10, it was found that the laminate-type white color reflecting substrate formed by adding and dispersing 25 phr of rutile-type titanium oxide has a reflectance value of 80% or over. From FIG. 11, given the change over time caused by heat aging, 50 phr or over rutile-type titanium oxide is needed to secure the reflectance value of 80%. From this, the additive amount of rutile-type titanium oxide is preferably 25 phr or over, more preferably 50 phr or over, when considering the change over time caused by heat aging.

As mentioned above, white-color reflecting materials having an improved light reflectance can be obtained by coating conventional substrates with the present titanium oxide-containing silicone compositions. In the change over time caused by heat aging, white-color reflecting substrates having higher light reflectance than that of the conventional ones were obtained by adjusting the amount of titanium oxide to be added. It was found that the present reflecting materials are useful for circuit boards as well as reflecting materials for semiconductor light-emitting units.

INDUSTRIAL APPLICABILITY

The present white-color reflecting materials made of titanium oxide-containing silicone can be used for semiconductor light-emitting units such as light emitting diodes (LED), optical semiconductor package members, electric wiring base plates on which semiconductor light-emitting components are mounted, lighting appliances based on the devices and members mentioned above, back light reflecting sheets, etc. The present white-color reflecting materials can be used for solar cell-related usage, as substrates that reflect incident light to condense light toward photoelectric conversion devices.

EXPLANATION OF LETTERS AND NUMERALS

1: semiconductor light-emitting unit, 2: solar cell assembly, 10: package molding member, 10a: ceramics package molding member, 11: inner wall, 12a, 12b: anatase-type titanium oxide particles, 13: semiconductor light-emitting component, 14a, 14b: lead, 15a, 15b: conductive metal film (copper film), 16, 16a, 16b, 16c: white color reflecting material, substrate (coating film), 17: support, 18: white color reflecting material, coating film, 20: base plate, 21a, 21b: masking layer, 22a, 22b: conductive metal film (copper film), 23: insulator, 24: solar cell component, 24a: p-type silicone semiconductor, 24b: n-type silicone semiconductor, 30: package molding member, 33: semiconductor light-emitting component, 34a, 34b: lead, 35a, 35b: conductive metal film (copper film), 40: substrate

What is claimed is:

1. A white color reflecting material comprising:
   a titanium oxide-containing silicone resin or titanium oxide-containing silicone rubber, wherein
      the titanium oxide-containing silicone resin or the titanium oxide-containing silicone rubber is formed by curing an unvulcanized silicone component composition having surface-treated anatase- or rutile-type titanium oxide particles dispersed therein, and
      rubber hardness of said silicone resin or said silicone rubber is in a Shore A hardness range of 30 to 90 or in a Shore D hardness range of 5 to 80.

2. The white color reflecting material according to claim 1, wherein the surface-treated anatase- or rutile-type titanium oxide particles have an average particle size of 0.05 to 50 μm and are contained as 5 to 400 parts by mass in 100 parts by mass of said silicone resin or said silicone rubber, and light reflectance thereof is at least not less than 80% thereby.

3. The white color reflecting material according to claim 1, wherein shaped form thereof is a three dimensional, film-like or plate-like shape for reflecting or diffusely reflecting light in the light-condensing or diffusing direction.

4. The white color reflecting material according to claim 3, wherein shaped form thereof is said plate-like or film-like shape on which a conductive metal film is placed for connecting the conductive metal film to a semiconductor optical device comprising a light-emitting component or a solar cell component.

5. The white color reflecting material according to claim 3, wherein a substrate having said film-like shape or the plate-like shape is placed on a conductive metal film, or a conductive metal film is placed on a substrate having said film-like shape.

6. The white color reflecting material according to claim 5, wherein a support is placed on a surface of said substrate having said film-like shape or the plate-like shape or said conductive metal film, which the surface is a non-mounted side of an optical component.

7. The white color reflecting material according to claim 6, wherein said conductive metal film is placed on said support, and said substrate having said film-like shape or the plate-like shape is placed on said conductive metal film.

8. The white color reflecting material according to claim 3, wherein a thickness of said film-like shape or the plate-like shape is in the range of 5 μm to 2,000 μm.

9. The white color reflecting material according to claim 3, wherein the white color reflecting material is a package molding member which surrounds an optical component comprising a light-emitting component or solar cell component, the package molding member having a three-dimensionally-shaped opening which spreads out wide toward a light-incident or exiting direction and accommodating the optical component therein.

10. The white color reflecting material according to claim 9, wherein a conductive metal film which is connected to said light emitting component is placed on a surface of the white color reflecting material, and a substrate on which the optical component is mounted and said package molding member is bonded or connected through adhesives or a chemical bond.

11. The white color reflecting material according to claim 10, wherein said substrate is made of a silicone resin or a silicone rubber.

12. The white color reflecting material according to claim 10, wherein a support is placed on a surface of said substrate, which the surface is a non-mounted side of a optical component.

13. The white color reflecting material according to claim 10, wherein at least one of a reinforcing material selected from the group consisting of a glass cloth, glass paper and glass fiber is contained in the substrate.

14. The white color reflecting material according to claim 9, wherein a semiconductor light-emitting unit which has said light emitting component or a solar cell which has said solar electron device is integrally placed on said substrate, and a plurality of said package molding members are placed side by side to surround said optical component.

15. The white color reflecting material according to claim 1, wherein said silicone resin or said silicone rubber has an active silyl group selected form the group consisting of a hydrosilyl-containing silyl group, a vinyl-containing silyl group, an alkoxysilyl-containing silyl group or a hydrolyzable group-containing silyl group.

16. A white color reflecting material comprising:
a silicone component composition containing titanium oxide, the silicone component composition including:
an unvulcanized silicone resin component that is cured to be a silicone resin, or
an unvulcanized silicone rubber component that is cured to be a silicone rubber; and
a surface-treated anatase- or rutile-type titanium oxide; wherein rubber hardness of the silicone resin or the silicone rubber is in a Shore A hardness range of 30 to 90 or in a Shore D hardness range of 5 to 80.

17. A method for producing a white color reflecting material of claim 1, comprising steps of;
performing a surface activation treatment of a surface of a support made of non-silicone resin,
coating a liquid or fictile titanium oxide-containing silicone composition which comprises a silicone resin or a silicone rubber and anatase-type or rutile-type titanium oxide particles dispersed in the silicone resin or the silicone rubber onto the activation treated surface, and
cross-linking and curing to form a layered body.

18. The method for producing a white color reflecting material according to claim 17, further comprising a step of;
providing a metal conductive layer on the cross-linked and cured titanium oxide containing silicone composition layer.

19. The white color reflecting material according to claim 1, wherein the surface-treated anatase- or rutile-type titanium oxide particles are treated with $Al_2O_3$, $ZrO_2$, or $SiO_2$, and/or a silane coupling agent on a surface thereof.

20. The white color reflecting material according to claim 1, wherein the unvulcanized silicone rubber component contains an unvulcanized silicone component and a silane coupling agent.

* * * * *